United States Patent [19]

Milkovic

[11] 4,217,546

[45] Aug. 12, 1980

[54] ELECTRONIC ENERGY CONSUMPTION METER AND SYSTEM WITH AUTOMATIC ERROR CORRECTION

[75] Inventor: Miran Milkovic, Scotia, N.Y.

[73] Assignee: General Electric Company, Somersworth, N.H.

[21] Appl. No.: 967,964

[22] Filed: Dec. 11, 1978

[51] Int. Cl.³ ............................................. G01R 21/06
[52] U.S. Cl. .................................................. 324/142
[58] Field of Search ..................... 324/142, 107, 127; 364/483

[56] References Cited

U.S. PATENT DOCUMENTS

| | | | |
|---|---|---|---|
| 3,602,843 | 8/1971 | De Vries | 324/142 X |
| 3,875,508 | 4/1975 | Milkovic | 324/142 |
| 3,875,509 | 4/1975 | Milkovic | 324/142 |
| 3,955,138 | 5/1976 | Milkovic | 324/142 X |
| 4,056,775 | 11/1977 | Milkovic | 324/142 |
| 4,058,768 | 11/1977 | Milkovic | 324/142 |
| 4,066,960 | 1/1978 | Milkovic | 324/142 |
| 4,118,787 | 10/1978 | Arnoux | 324/142 X |

Primary Examiner—Stanley T. Krawczewicz
Attorney, Agent, or Firm—Robert E. Brunson

[57] ABSTRACT

An electronic energy consumption meter and system includes means for automatically correcting for overall system signal and voltage errors and offset errors created by circuits in the system to provide a meter requiring no adjustments for the compensation of the various system and circuit errors.

7 Claims, 2 Drawing Figures

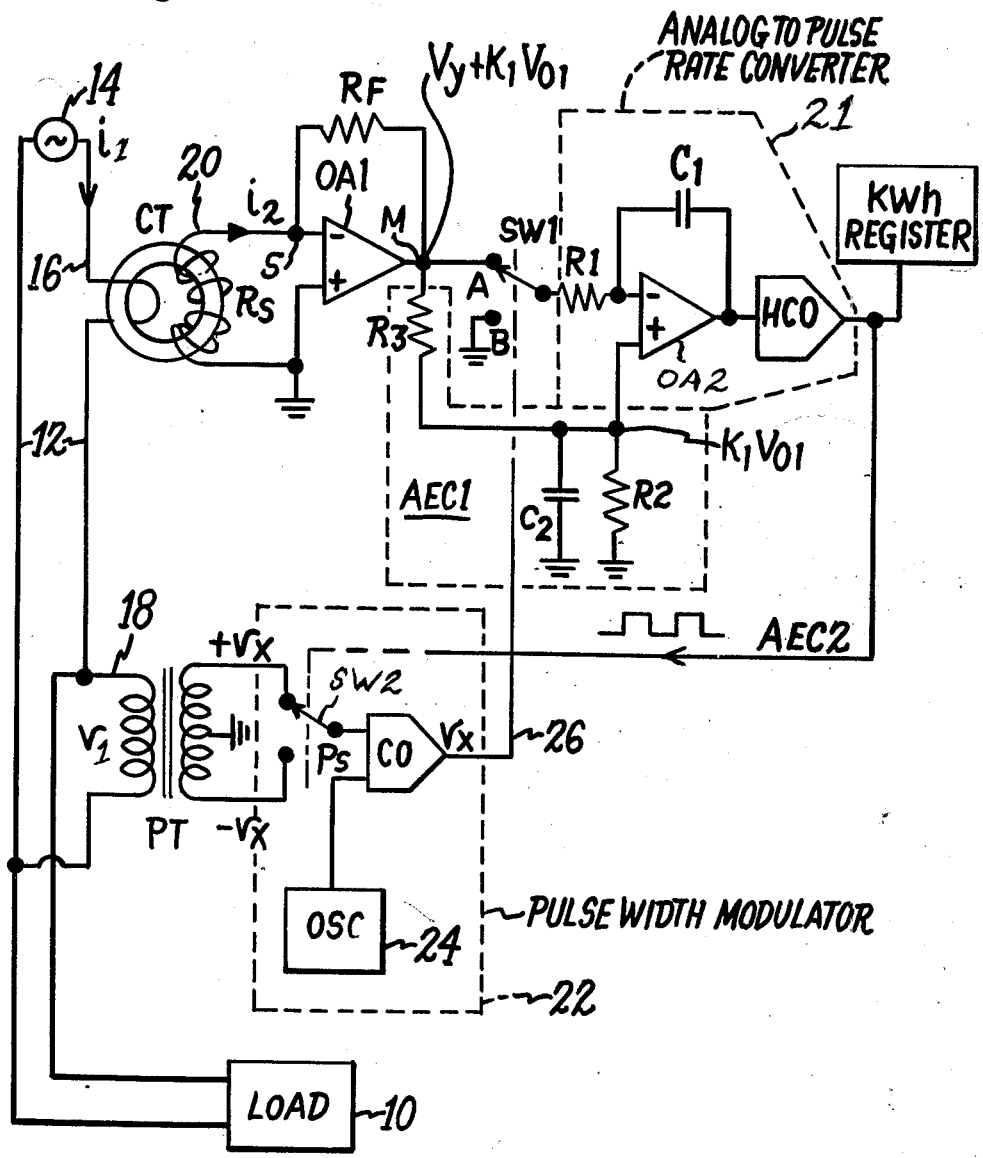

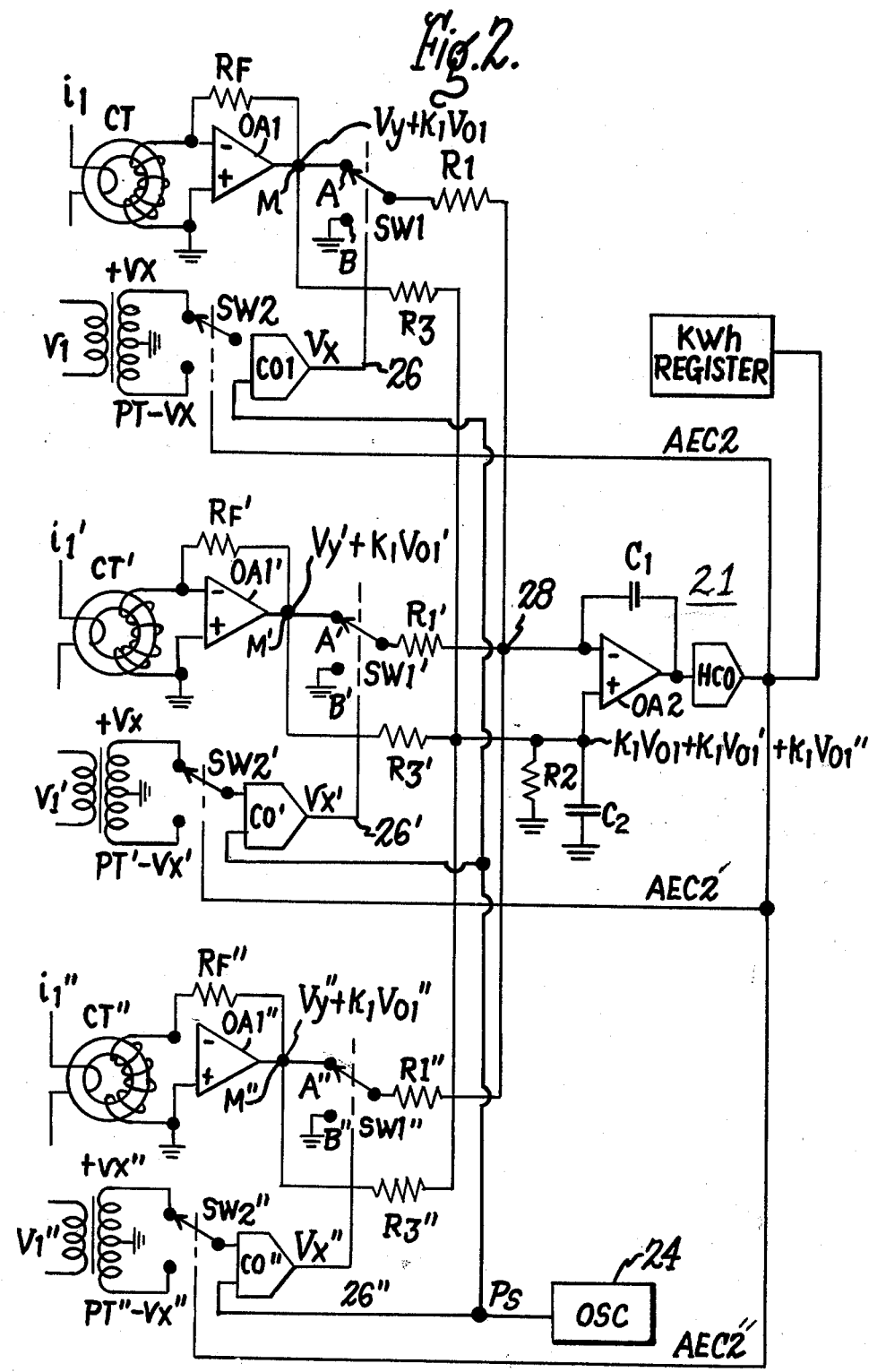

ELECTRONIC ENERGY CONSUMPTION METER AND SYSTEM WITH AUTOMATIC ERROR CORRECTION

BACKGROUND OF THE INVENTION

The present invention pertains generally to new and improved single phase and polyphase electronic energy consumption meters and systems which operate according to the time-division or amplitude mark-space-modulation method or technique generally described in my earlier U.S. Pat. Nos. 3,875,509; 3,875,508; and 3,955,138. More particularly the present invention relates to meters and metering systems of the above type utilizing a low cost active terminated current transformer circuit such as that generally described in my earlier U.S. Pat. No. 3,815,013 capable of automatically compensating for or cancelling out all signal errors introduced into the system by the various circuits, components, supply voltage differences and the like.

The entire disclosure of the aforementioned earlier patents is hereby incorporated by reference. The entire right, title and interest in and to the invention described in the aforesaid patents and the entire right, title and interest in and to the invention herein disclosed, as well as in and to the patent application of which this specification is a part, are assigned to the same assignee.

The aforementioned basic time-division or amplitude-mark-space modulation technique (it is commonly referred to by these and/or similar names in the art) is also disclosed elsewhere in the art such as in U.S. Pat. No. 3,602,843; Canadian Pat. No. 801,200; Swiss Pat. No. 472,677 and in various publications such as various ones of the published papers presented at I.E.E. Metering Conference held in London, England during September of 1972.

It is well known in the art (e.g. see my aforementioned U.S. Pat. No. 3,955,138) in order to obtain a measure of power (i.e., the rate of electrical energy consumption) that two analog signals, current and voltage, are multiplied and the product then integrated to obtain a measure of the actual energy consumption. In my earlier referenced patents, the two analog variables or signals are multiplied by alternately switching the polarity of one of the signals in response to a control signal that is pulse-width modulated in proportion to the other signal. The product, or result, is a pulse train wherein the instantaneous pulse-height or magnitude is proportional to one signal and the instantaneous pulse-width is proportional to the other signal. When this pulse train is integrated, a variable analog signal is developed having a D.C. component, resulting from the width and amplitude modulated pulses, which is proportional to power consumption. Utilizing this variable analog signal, a hysteresis comparator (such as that shown by elements CO1, CO2 and FF1 of FIGS. 4-6 of my patent 3,955,138) generates a unit energy output pulse each time a predetermined fixed amount of electrical energy has been consumed. Thus, the output of the hysteresis comparator provides a train of pulses which may be counted, accumulated and displayed to indicate the total energy consumption.

In systems of the type under discussion, one of the problems is the elimination of error signals introduced into the system due to transformer phase shift characteristics, power supply voltage differentials, stray capacitances, offset errors introduced by circuit components, such as inherently unbalanced differential amplifiers and the like. The presence of a total system error signal is recognized in my aforementioned U.S. Pat. No. 3,955,138 wherein that signal is defined as $V_e$. This error signal is largely eliminated in the system of that patent by utilizing the polarities of the pulses from the hysteresis converter to control the polarity and the switching times of a pulse train to an integrator to automatically cancel out, with time, the error by the alternate positive and negative integration of the error signal. This cancellation of the error signal $V_e$ results in an overall improvement in the measurement accuracy of the system as well as providing long term stability.

While the invention in my U.S. Pat. No. 3,955,138 provides a sound economical design, it is desirable to further reduce the cost of such designs while providing a metering system having enhanced measurement accuracy by not only automatically compensating for the aforementioned system error signal, but which further compensates for additional offset errors inherent in the circuits used in such metering systems.

SUMMARY OF THE INVENTION

According to the invention, a watthour meter for use in metering systems which monitor a current variable utilizes a low cost current transformer terminated in an active load similar to that generally described in my U.S. Pat. No. 3,815,013. The active load comprises an operational amplifier for amplifying the current variable to generate an output voltage proportional to the magnitude of the current and which possesses an offset error signal which can affect the meter measurement accuracy. The output voltage or signal from the operational amplifier has an AC component proportional to current and further contains a DC component proportional to the offset error. The offset error is automatically compensated for by a first automatic offset error correction loop which senses the magnitude of the offset error to effect the compensation or cancellation thereof in a common mode rejection integrator of an analog to pulse rate converter also receiving the output voltage from the operational amplifier via a multiplier. The analog to pulse rate converter generates data pulses proportional to measured power consumption.

A second automatic error correction loop for compensating for the aforementioned system errors $V_e$ further enhances the meter accuracy by feeding the data pulses from the output of the analog to pulse rate converter to switch a pulse width modulator. The pulse width modulator generates positive and negative width modulated output pulses, wherein the instantaneous pulse width of an output pulse is proportional to the corresponding instantaneous magnitude of the voltage variable being monitored.

The modulated output pulses are multiplied in the multiplier with the output voltage from the operational amplifier whereby the magnitude and pulse width of the output voltage applied to the integrator represents a pulse train proportional to energy consumption. Further, the reversing polarities of the modulated output pulses effect a positive and negative integration of the output voltage from the operational amplifier which cancels out the aforementioned system errors. Accordingly, it has been found that the two error correction loops greatly improve the accuracy of the meter and significantly extend its dynamic operating range.

It is therefore an object of the present invention to provide a new and improved electronic energy consumption meter having enhanced operating capabilities.

It is another object of the present invention to provide an electronic energy consumption metering system utilizing a low cost transformer terminated in an active load which is capable of compensating for system errors and offset errors introduced by circuitry in the system and which provides long term stability.

It is a further object of the present invention to provide a solid state electronic energy consumption metering system operating in accordance with the time division or amplitude-mark-space-modulation technique which is capable of compensating for system induced electrical errors to improve the accuracy and extend the dynamic operating range of the system.

A still further object of the present invention is to provide a new and improved electronic energy consumption meter of economical design utilizing a low cost transformer terminated in an active load.

BRIEF DESCRIPTION OF THE DRAWING

The preceding objects and advantages of the invention will be more clearly appreciated by reading the following detailed description taken in conjunction with the accompanying drawing in which:

FIG. 1 is a schematic diagram of a single phase electronic energy consumption meter in accordance with the present invention; and FIG. 2 is a schematic diagram of a polyphase electronic energy consumption meter according to this invention.

DESCRIPTION OF THE PREFERRED EMBODIMENT

Referring initially to one illustrated embodiment of the invention as shown in the schematic diagram of FIG. 1, there is illustrated a single phase electronic consumption meter and system for monitoring the electrical energy consumed in a load 10 via an electrical circuit 12 having a line voltage $V_1$ and a line current $i_1$ generated by an alternating current generator or power source 14. A primary winding 16 of a current transformer CT is connected in series with the line current $i_1$ while a primary winding 18 of a potential transformer PT is connected in parallel across the line voltage $V_1$.

As illustrated, the current transformer CT has a secondary winding 20 producing a current $i_2$ which is proportional to the line current $i_1$. The secondary winding 20 is connected to positive (+) and negative (−) input terminals of a transresistance feedback operational amplifier designated as OA1 having a feedback resistor RF. In accordance with the invention, the feedback amplifier OA1 and RF provide an alternating or varying output voltage or signal proportional to transformer current $i_1$ or $i_2$. In operation, the feedback amplifier OA1 represents a very low input impedance to the output of the current transformer CT so that the secondary winding 20 is virtually short-circuited. The transresistance feedback amplifier OA1 serves as an active load for the current transformer CT and operates under ideal conditions (short circuit) to develop a voltage signal at its output terminal proportional to the line current $i_1$. This voltage signal may be used for metering purposes or the like as will be described.

Still referring to FIG. 1, the − input of the operational amplifier OA1 is an inverting input and the + input terminal is a non-inverting input. The feedback resistor $R_F$ is connected in parallel with the amplifier OA1 between a summing point S and a junction point M, the latter defining the output terminal of the amplifier OA1. For all practical purposes, the + input terminals of amplifier OA1 are at the same potential.

The details of the operation for the circuit comprising the current transformer CT and the operational amplifier OA1 are disclosed in detail in my aforementioned U.S. Pat. No. 3,815,013. Therefore, that patent is incorporated herein by reference for those specific details. In the illustrated embodiment of FIG. 1, the operational amplifier OA1 is identified as a high performance operational amplifier such as a uA741 manufactured by Fairchild Semiconductor, a division of Fairchild Camera and Instrument Corporation, 313 Fairchild Drive, Mountainview, California. The Fairchild operational amplifier, uA741 is an integrated circuit device, the details of which are illustrated in U.S. Pat. No. 3,915,013.

In the present embodiment, while it is recognized that the ± input terminals of amplifier OA1 are substantially at the same potential, it should also be recognized that a very slight voltage difference creates a DC output offset error voltage $K_1V_{01}$ at the output M of the amplifier, with an output voltage $V_y$, which is summed in the amplifier with $K_1V_{01}$, representing the output voltage $i_2 \cdot R_f$ proportional to line current $i_1$. To understand the reason for this output offset error voltage ($K_1V_{01}$), it is necessary to realize that a certain input voltage is necessary to balance an operational amplifier.

The source of the output offset error voltage is due to a mismatch of transistor emitter base bias voltages in the complementary bipolar transistor differential input stage of the amplifier. To provide zero output from an operational amplifier such as OA1, the input voltage of the amplifier input terminals must both be equal, however, in practicality this is not possible. In amplifiers of the type utilized in the present invention, DC coupled differential input stages in those amplifiers always draw some input bias currents from the signal source such as transformer CT, thus developing voltage drops in the signal source resistances. If the signal source resistances presented to the amplifier inputs are not equal, a differential error voltage is developed between the inputs. Further, unequal bias currents from power supplies feeding the amplifier create an input offset current which can produce a differential input error voltage even when source resistances are equal.

Normally, biasing circuits are utilized externally to the input of operational amplifiers to compensate for the input offset error voltage. Generally this is accomplished by the connection of a potentiometer to the negative input of the operational amplifier to balance out the differential inputs of that amplifier to compensate for any differential in the voltages applied to the input terminals. This type of adjustment however, has a distinct disadvantage in that it should be recognized that operational amplifiers have an inherent drift characteristic with temperature changes, thus necessitating a constant re-adjustment of the offset input voltage. This is an undesirable characteristic in situations where it is desirable to have an accurate meter which must be operated unattended and which, inherently, requires no periodic adjustments. Thus, in the present invention, means is provided through a first automatic error correction network (designated AEC1), which compensates for this offset error voltage at the output of amplifier of OA1 without the need for any circuit adjustments.

Still referring to FIG. 1, the output voltage or signal from amplifier OA1 is comprised of components $V_y + K_1 V_{01}$. $V_y$ is an alternating analog output signal which varies in proportion to the input current $i_1$ to transformer CT, whereas $K_1 V_{01}$ represents the total DC voltage offset error created in amplifier OA1. $V_{01}$ is the actual offset voltage of the amplifier and $K_1$ is a coefficient which is $1 + RF/RS$. RS is the resistance of the secondary winding of the transformer CT, with RS and RF serving to establish the gain of amplifier OA1. These two components $K_1$ and $V_{01}$, when multiplied together, give the total DC offset voltage error from the amplifier OA1.

Referring now to the automatic error correction means AEC1 of FIG. 1, there is shown a network comprised of resistors R2, R3 and a capacitor C2. The resistor R3 is connected at one end to the output M of operational amplifier OA1 and connected at its other end to resistor R2. A signal bypass, or roll off capacitor C2 is connected at one end to the junction of resistors R2 and R3, whereas, the other ends of resistors R2 and C2 are connected to a common potential designated as ground. As indicated in FIG. 1, the total DC offset error voltage appears across resistor R2 as $K_1 V_{01}$. As previously mentioned, the output signal from amplifier OA1 is a varying analog signal which includes the DC offset error component $K_1 V_{01}$. The total signal $V_y + K_1 V_{01}$ is applied to the error correction network AEC1 via resistor R3. However, the capacitor C2, having a value of approximately 0.1 microfarad, serves as a bypass or roll off capacitor to effectively ground the AC component $V_y$. Thus, it can be seen that only the DC offset error $K_1 V_{01}$ appears across R2 and thus at a positive (+) input to an integrating operational amplifier OA2 of an analog to pulse rate converter 21.

Still referring to FIG. 1, it will also be noted that the output signal $V_y + K_1 V_{01}$ is applied to an A terminal of a switch or multiplier SW1. When SW1 is in the position shown the output of OA1 is applied to a negative (−) input of integrator OA2 via a resistor R1. To compensate for the offset error voltage $K_1 V_{01}$ from OA1, the present invention takes advantage of the excellent common mode rejection characteristics of integrator amplifier OA2. Amplifier OA2 can also be a uA741 type amplifier. Other types of operational amplifiers are also suitable for use as OA1 and OA2. Ideally, in an operational amplifier, the same voltage connected to each input will produce a zero result at the output since the operational amplifier would only detect the difference in the two input voltages. The voltage which both inputs experience is known as the common mode voltage. In the present invention, the DC component offset voltage $K_1 V_{01}$ of amplifier OA1 is applied to the positive and negative input terminals of amplifier OA2. While the amplitudes of the voltage at the ± inputs of OA2 are approximately equal, there is a slight difference. Because of the common mode rejection characteristics of amplifier OA2, this slight difference is completely rejected by the amplifier and thus the offset error does not appear at the output of amplifier OA2.

Still referring to FIG. 1, reference is now made to the potential transformer PT. The secondary voltage on the potential transformer PT is proportional to the analog voltage variable or line voltage $V_1$. Thus, the analog voltage variable presented to the primary winding 18 is transformed through transformer PT and applied to the input of a pulse width modulator 22. The modulator 22 is comprised of a single pole double throw switch SW2, a comparator CO and an oscillator 24. The pulse width modulator 22 may, for example, be of the type shown in FIGS. 14 and 20 of my earlier above referenced U.S. Pat. No. 3,875,509. In particular, the pulse width modulator 22 is of a type which produces width modulated pulses $V_x$ at an output 26 wherein, the instantaneous pulse width of an output pulse $V_x$ is proportional to the corresponding instantaneous magnitude of the input voltage variable at the input of the pulse width modulator. As shown in FIG. 1, the oscillator 24 provides sampling pulses PS to the comparator CO. Typically, the sampling frequency of the pulse width modulator (output of oscillator 24) is fixed at some relatively high value (that is, the sampling rate can be in the order of 6,000 to 10,000 hertz as compared to a line frequency of 50 hertz or 60 hertz) so that a large number of width modulated pulses are produced at output 26 for each cycle of line voltage/current.

The secondary of the potential transformer PT is center tap grounded to provide at its respective output terminals two voltages or variables $+v_x$ and $-v_x$. These output terminals are connected to corresponding input terminals of switch SW2, which may comprise a CMOS switch. SW2 has a single output terminal providing one input to the comparator CO. The other input to comparator CO is from the oscillator 24. In a manner to subsequently be described, the switch SW2 is controlled by pulses designated AEC2 (for error correction loop 2) from the output of a hysteresis comparator HCO. The analog switch SW2 is connected such that the two output voltages $+v_x$ and $-x_x$ from transformer PT are controllably and alternatively connected to the input of the comparator CO. As the switch is alternated between the secondary terminals of the transformer PT, the output of the comparator CO generates pulse width modulated pulses $v_x$ which are varied in positive and negative directions due to the changing polarities of the input signals $+v_x$ and $-v_x$ to the comparator CO. These pulse width modulated output pulses are thus applied to control switch SW1 (which may also be a CMOS switch) to effect the alternating of that switch between positions or states A and B in response to the positive and negative transitions of the output signal $V_x$. As can be seen in FIG. 1, if switch SW1 were continuously left in state A, its output would be continuously proportional to the output $V_y + K_1 V_{01}$ of the amplifier OA1. On the other hand, if switch SW1 were continuously left in state B, then the switch output would constantly be proportional to the common potential (ground) to which the B terminal is connected.

In FIG. 1, the combination of SW1 and the pulse width modulator 26 comprises a pulse width amplitude type (or time division) multiplier. The output of SW1, (the input to the − terminal of amplifier OA2) is a pulse width modulated pulse train proportional to $V_x(V_y + K_1 V_{01})$. This effects the generation of an alternating signal or pulse train from SW1 at a sampling frequency of several kolohertz (6 kilohertz) wherein the net output is a pulse train which alternates in polarity and wherein the instantaneous magnitude of any given pulse is proportional to the line current $i_1$ while the instantaneous width or mark space ratio of the pulses is proportional to the line voltage $v_1$.

During the positive half of the pulse width modulated signal $v_x$ from comparator CO, the switch SW1 is in position A. This effects the generation of a signal at the output of amplifier OA2 which is an integrated signal having a value $v_y v_x$ (the error voltage $K_1 V_{01}$ is rejected or compensated for by OA2). While SW1 is in position A, a capacitor C1 charges up to the integrated value of $v_y v_x$ at a time constant determined by the values of C1 and R1 of amplifier OA2.

As explained in my aforementioned U.S. Pat. No. 3,955,138, the analog to pulse rate converter contains a hysteresis comparator similar to that as shown by HCO in FIG. 1. As explained in that patent, the hysteresis comparator HCO is an up down integrator comparator which causes HCO to generate a first pulse output signal when the magnitude of the input signal from the output of the amplifier OA2 reaches a first prescribed magnitude or threshold level. When this threshold level is reached, the output of comparator HCO generates a pulse AEC2 which causes the switch SW2 to now switch from $+v_x$ to $-v_x$. When this occurs, the output $v_x$ from comparator CO changes polarity to switch SW1 to position B. This now applies a signal of reversed polarity (or ground potential) to the input of amplifier OA2 causing the integrator to start integrating down. When the integrator output of OA2 begins to integrate down, capacitor C1 is discharged. Now, when the output voltage from OA2 reaches a prescribed second magnitude or threshold level, the output of HCO reverses its polarity to provide a second pulse of opposite polarity to switch SW2 causing it to switch to the $+v_x$ position. This now causes the $v_x$ signal at the output of comparator CO to thus switch SW1 back to position A. SW2 continues to be switched by the AEC2 pulses in the manner just described.

As was previously mentioned, the offset error $K_1 V_{01}$ at the input of amplifier OA2 is one error which is present in the system. In addition to that error, there is another error designated $V_e$, which as described in my aforementioned U.S. Pat. No. 3,955,138, represents a total system error signal referred to the input of integrator OA2. This error is due to certain offset voltages which appear in amplifier OA2, comparator HCO and comparator CO, as well as other system components within the system. This overall system error is cancelled out as explained in the following paragraph.

During a first time, T0 to T1 (TA) the capacitor C1 is charged by the average input signal $v_x(V_y + K_1 V_{01})$ and by an error signal $V_e$ at the negative input of amplifier OA2. At a time $T = T1$, the output voltage from amplifier OA2 becomes equal to the first threshold level of the comparator HCO. At this time the output of HCO changes from a first state to a second state, causing the polarity of the EAC2 signal to change state. The switch SW2 is now activated, switching the input to comparator CO to the $-v_x$ position. Therefore, $v_x$ changes polarity, switching SW1 to position V, causing the integrator to integrate downward during T1 to T2 (TB) with an average signal reference potential (ground) which includes the error signal $v_e$. Since the polarity of the − input to amplifier OA2 does change by the changing of $v_x$ but $v_e$ does not change, the error is added during TA and substracted during TB. The error thus averages out and is cancelled during the overall measurement period, TA + TB.

As previously explained, the output of amplifier of OA2 is an integrated signal proportional to the product of $v_y$ and $v_x$. By virtue of the common mode rejection characteristics of amplifier OA2, the $K_1 V_{01}$ offset error in amplifier OA1 is virtually eliminated. In addition, the overall system error $v_e$ is also cancelled out due to the switching actions of SW1 and SW2. As the integrator output of OA2 integrates up and down, the hysteresis comparator HCO is activated to generate a string of output pulses AEC2 which is proportional to the product of $v_y$ and $v_x$. Thus, it can be seen that the final output AEC2 of the invention of FIG. 1, is a digital representation of the electrical energy consumed by the load 10. Also, as shown in FIG. 1, this digital output AEC2 may be utilized to drive a digital display and/or accumulator shown as a kilowatt hour register for purposes of permanently recording the amount of electrical energy consumed.

The proposed method and apparatus for accurately measuring the amount of energy consumed by the load 10, while compensating or eliminating the aforementioned system errors, can also be applied to any other combination or function of electronic metering. For example, in FIG. 2 a polyphase electronic kilowatt hour meter is shown with three metering circuits, each with their own active current transformer and potential transformer connected into a three phase electrical system. It is significant to note in the embodiment of FIG. 2, that only one oscillator 24 is required for the pulse width modulator for each of the three phase monitoring circuits. Further, it will be noted that only one analog to pulse rate converter 24 is utilized, whereby the input to the negative terminal of integrator OA2 is provided from switch SW1 of the corresponding phase monitoring circuits at a junction or summing point 28. The detailed operation of the circuit shown in FIG. 2 is directly analogous to that already discussed with respect to FIG. 1 so that further detailed discussion is not believed necessary. However, it will be noted in FIG. 2, that the various components which correspond to the numbered components of FIG. 1, are labeled with ′ and ″ notations.

Although this invention has been described with respect to particular exemplary embodiments, those in the art will appreciate that it is possible to modify many features of those exemplary embodiments without departing from the improved teachings and features of this invention. Accordingly, all such modifications are intended to be incorporated within the scope of this invention.

What is claimed is:

1. An improved electronic meter of the type for monitoring electrical energy consumption in a load, whereby the consumption is represented by electric current and voltage signals according to the time-division or amplitude-mark-space-modulation method comprising:
   (a) a first transformer having a primary winding connected to receive one of the signals to be monitored and a secondary winding providing a first signal proportional thereto;
   (b) a second transformer having a primary winding connected to receive the remaining one of the signals to be monitored and a secondary winding providing a second signal proportional thereto;
   (c) a transresistance amplifier for terminating the secondary winding of said second transformer and serving as an active load which virtually short circuits the latter secondary winding while supplying an output signal having an AC component proportional to the primary current of said second transformer and which possesses a DC offset error component generated by said transresistance amplifier;

(d) a pulse-width modulator operatively connected to receive the first signal from said first transformer for producing repetitive modulated output pulse signals having instantaneous pulse-widths proportional to the corresponding instantaneous magnitude of said first signal;

(e) an analog to pulse rate converter including an integrating operational amplifier having first and second input terminals and an output terminal, said operational amplifier possessing high common mode rejection characteristics to signals applied to the input terminals thereof;

(f) a switch operatively connected to be automatically switched between first and second states in response to said repetitive modulated output pulse signals, said switch having a first input terminal connected to receive the output signal from said transresistance amplifier, a second input terminal connected to a potential source and an output terminal connected to the first input terminal of said operational amplifier; and (g) an offset error voltage correction network connected between the output of said transresistance amplifier and the second input terminal of said operational amplifier for rejecting the alternating current component of the output signal of said transresistance amplifier to apply only the offset error voltage component to the second input terminal of said operational amplifier, whereby the offset error voltage in the output signal of said transresistance amplifier is automatically compensated for, due to the common mode rejection characteristics of the operational amplifier, in said analog to pulse rate converter as said switch is switched between said first and second states to alternately connect the first and second input terminals respectively of said switch to the first input terminal of said operational amplifier to provide a unit-energy output pulse from said analog to pulse rate converter each time a predetermined fixed unit amount of energy has been consumed by said load.

2. An electronic meter for monitoring the amount of electrical energy consumed by an electrical load connected to a power source generating current and voltage signals to be combined by the time-division or amplitude-mark-space-modulation method to provide data representative of the amount of energy consumed by the load comprising:

(a) a current transformer having a primary winding connected to said power source and providing a first output signal at a secondary winding thereof proportional to current in the primary winding;

(b) a transresistance amplifier for terminating the secondary winding of said current transformer and serving as an active load which virtually short-circuits the secondary winding while supplying an output voltage having an AC component proportional to the current in the primary winding of said current transformer and which possesses an offset error signal component introduced by said transresistance amplifier;

(c) a potential transformer having a primary winding connected to said power source and providing a second output signal at a secondary winding thereof proportional to voltage in the primary winding of said second transformer;

(d) a pulse-width modulator operatively connected to receive said second output signal for producing repetitive modulated output pulse signals having instantaneous pulse-widths proportional to the corresponding instantaneous magnitude of said second output signal;

(e) a single pole double throw electronic switch operatively connected to be automatically switched between first and second states in response to said repetitive modulated output signals, said switch having first and second input terminals corresponding, respectively, to said first and second states and an output terminal, said first input terminal being connected to receive the output voltage from said transresistance amplifier and said second input terminal being connected to a source of common potential;

(f) an offset error signal compensation network having an input connected to receive the output voltage from said transresistance amplifier, and having an output for providing an error compensation voltage having a value proportional to the magnitude of the offset error signal in the output voltage of said transresistance amplifier; and (g) an analog to pulse rate converter operatively connected to receive said error compensation signal and the output voltage of said transresistance amplifier from the output terminal of said electronic switch, said analog to pulse rate converter including means for rejecting the offset error signal in the output voltage of said transresistance amplifier and means to provide data in the form of a unit-energy output pulse each time a predetermined fixed amount of energy has been consumed by the load, whereby each unit-energy output pulse is representative of the product of said first and second signals and hence to the power consumption represented by the monitored current and voltage signals.

3. An improved electronic meter of the type for monitoring electrical energy consumption in a load, whereby the consumption is represented by electric current and voltage signals according to the time-division or amplitude-mark-space-modulation method comprising:

(a) a first transformer having a primary winding connected to receive one of the signals to be monitored and a secondary winding providing a first signal proportional thereto;

(b) a second transformer having a primary winding connected to receive the remaining one of the signals to be monitored and a secondary winding providing a second signal proportional thereto;

(c) a transresistance amplifier for terminating the secondary winding of said second transformer serving as an active load which virtually short circuits and the latter secondary winding while applying an output voltage proportional to the primary current of said second transformer and which has an offset error signal, to be compensated for, which is introduced in said transresistance amplifier by the connection of said second transformer to said transresistance amplifier;

(d) an analog to pulse rate converter including an integrating amplifier having first and second input terminals and an output terminal for providing an unit-energy output pulse each time a predetermined fixed unit amount of electrical energy has been consumed by said load;

(e) a first switch operatively connected to be automatically switched between two possible states in response to each unit energy output pulse from said analog to pulse rate converter, said first switch having first and second input terminals connected across the secondary winding of said first transformer and an output terminal for providing said first signal as a switched output as said first switch is operated between said first and second input terminals;

(f) a pulse-width modulator operatively connected to receive the switched output from the output terminal of said first switch and to produce repetitive modulated output pulse signals having instantaneous pulse widths proportional to the corresponding instantaneous magnitude of said first signal;

(g) a second switch operatively connected to be automatically switched between two possible states in response to said repetitive modulated output pulse signals, said second switch having a first input terminal connected to receive the output voltage from said transresistance amplifier, a second input terminal connected to a potential source and an output terminal connected to the first input terminal of said integrating amplifier for providing pulses varying in amplitude and width proportional to the product of said first and second signals; and (h) an offset error signal correction network including,
  (1) first and second resistors each connected at one end thereof to form a junction, said first resistor connected at its other end to receive the output signal from said trans-resistance amplifier and said second resistor connected at its other end to said potential source,
  (2) a capacitor connected in parallel with said second resistor, and
  (3) means connecting the junction of said first and second resistors to the second input terminal of said analog to pulse rate converter whereby an offset error correction signal appears at the second input terminal of said analog to pulse rate converter to automatically compensate therein for the offset error signal present in the output voltage of said transresistance amplifier to effect the generation of a unit-energy output pulse from the output terminal of said analog to pulse rate converter each time a predetermined fixed unit amount of electrical energy has been consumed by said load; and (i) accumulating means connected to the output terminal of said analog to pulse rate converter to count the number of unit-energy output pulses produced and thus accumulate data indicative of the total energy consumption represented by said electric current and voltage signals.

4. An electronic meter for monitoring the amount of electrical energy consumed by an electrical load connected to a power source generating current and voltage signals to be combined by the time-division or amplitude-mark-space-modulation method to provide data representative of the amount of electrical energy consumed by the load comprising:

(a) a current transformer having a primary winding connected to said power source and providing a first output signal at a secondary winding thereof proportional to current in the primary winding;

(b) an operational amplifier for terminating the secondary winding of said current transformer for supplying an output signal proportional to the current in the primary winding of said current transformer and which contains an offset error voltage to be compensated for;

(c) a potential transformer having a primary winding connected to said power source and providing a second output signal at the secondary winding thereof proportional to voltage in the primary winding of said potential transformer;

(d) a pulse-width modulator operatively connected to receive said second signal for producing repetitive modulated output pulse signals having instantaneous pulse widths proportional to the corresponding instantaneous magnitude of said second output signal;

(e) an analog to pulse rate converter having first and second input terminals and an output terminal;

(f) a switch connected between the output of said operational amplifier and the first input terminal of said analog to pulse rate converter, said switch being responsive to the output pulse signals from said pulse-width modulator to automatically operate said switch to periodically provide the output signal from said operational amplifier to the first input terminal of said analog to pulse rate converter as a signal proportional to the product of the current and voltage in the primary windings of said current and voltage transformers respectively; and (g) means connected between the output of said operational amplifier and the second input terminal of said analog to pulse rate converter for providing a voltage thereto proportional to the offset error voltage in the output signal from said operational amplifier, whereby the offset error voltage in the output signal from said operational amplifier is automatically compensated for in said analog to pulse rate converter and to provide at the output terminal thereof data in the form of a unit-energy output pulse each time a predetermined fixed amount of energy has been consumed by said load.

5. An electronic meter for monitoring the amount of electrical energy consumed by an electrical load connected to a power source generating current and voltage signals to be combined by the time-division or amplitude-mark-space-modulation method to provide data representative of the amount of electrical energy consumed by the load comprising:

(a) a current transformer having a primary winding connected to said power source and providing a first output signal at a secondary winding thereof proportional to current in the primary winding;

(b) an operational amplifier for terminating the secondary winding of said current transformer for supplying an output signal proportional to current in the primary winding of said current transformer;

(c) a potential transformer having a primary winding connected to said power source and providing a second output signal at a secondary winding thereof proportional to voltage in the primary winding of said potential transformer;

(d) a pulse width modulator operatively connected to receive said second signal for producing repetitive modulated output pulse signals having instantaneous pulse widths proportional to the corresponding instantaneous magnitude of said second signal;

(e) an analog to pulse rate converter having an input terminal and an output terminal;

(f) a switch connected between the output of said operational amplifier and the input terminal of said analog to pulse rate converter, said switch being responsive to the output pulse signals from said pulse width modulator to automatically operate said switch to periodically provide the output signal from said operational amplifier to the input terminal of said analog to pulse rate converter as a signal proportional to the product of the current and voltage in the primary windings of said current and potential transformers respectively to provide at the output terminal of said analog to pulse rate converter data in the form of a unit energy pulse each time a predetermined fixed amount of electrical energy has been consumed by said load.

6. An electronic meter for monitoring the amount of electrical energy consumed by an electrical load connected to a power source generating current and voltage signals to be combined by the time-division or amplitude mark-space modulation method to provide data representative of the amount of electrical energy consumed by the load comprising:

(a) a current transformer having a primary winding connected to said power source and providing a first output signal at a secondary winding thereof proportional to current in the primary winding;

(b) an operational amplifier for terminating the secondary winding of said current transformer for supplying an output signal proportional to the current in the primary winding of said current transformer;

(c) a potential transformer having a primary winding connected to said power source and providing a second output signal at a secondary winding thereof proportional to voltage in the primary winding of said potential transformer;

(d) an automatically operable first switch, said switch having first and second inputs connected across the secondary winding of said potential transformer and further having an output which is controllably and alternatively connected to said first and second inputs in response to data pulses provided thereto representative of the amount of energy consumed by said load to provide the second output signal at the output of said first switch as a signal of switching polarity;

(e) a pulse width modulator operationally connected to receive said second signal from the output of said first switch to produce repetitive output pulse signals having instantaneous pulse widths proportional to the corresponding instantandous magnitude of said second signal;

(f) an analog to pulse rate converter having an input terminal and an output terminal, said output terminal providing said data pulses to said first switch for the automatic operation thereof;

(g) a second switch connected between the output of said operational amplifier and the input terminal of said analog to pulse rate converter, said second switch being responsive to the output signals from said pulse width modulator to automatically operate said second switch to periodically provide the output signal from said operational amplifier to the input terminal of said analog to pulse rate converter as a pulse-width amplitude modulated signal proportional to the product of the current and voltage in the primary windings of said current and potential transformers respectively to effect, at the output terminal of said analog to pulse rate converter, the generation of a unit energy pulse, as said data pulses, each time a predetermined amount of electrical energy has been consumed by said load.

7. An electronic meter of the type for monitoring electrical energy consumption in a load of a polyphase electrical system, whereby, the consumption is represented by current and voltage signals in each phase of the system according to the time division or amplitude-mark-space modulation method comprising:

(a) a plurality of metering circuits, for monitoring the signals of corresponding phases of said polyphase electrical system, each metering circuit including, (1) a first transformer having a primary winding connected to receive one of the signals to be monitored from a corresponding phase and a secondary winding providing a first signal proportional thereto, (2) a second transformer having a primary winding connected to receive the remaining one of the signals to be monitored from a corresponding phase and a secondary winding providing a second signal proportional thereto, (3) a transresistance amplifier for terminating the secondary winding of said second transformer and serving as an active load which virtually short circuits the latter secondary winding while supplying an alternating current output signal component proportional to the primary current of said second transformer and which possesses an offset error voltage component generated by said transresistance amplifier, (4) a pulse-width modulator operatively connected to receive the first signal from said first transformer for producing repetitive modulated output pulse signals having instantaneous pulse-widths proportional to the corresponding instantaneous magnitude of said first signal, (5) a switch operatively connected to be automatically switched between first and second states in response to said repetitive modulated output pulse signals, said switch having an output terminal, a first input terminal connected to receive the output signal from said transresistance amplifier, and a second input terminal connected to a potential source, (b) means for connecting the output terminal of the switch of each of said metering circuits together to form a summing junction;

(c) an offset error voltage correction network connected in common to the output of the transresistance amplifier of each of said plurality of metering circuits for rejecting the alternating current component of the output signal from each transresistance amplifier whereby only the offset error voltage component in each transresistance amplifier output signal is passed by said offset error voltage correction network; and (d) an analog to pulse rate converter including an integrating operational amplifier having a first input terminal connected to said summing junction for receiving the output signal from the output of each transresistance amplifier, and a second input terminal for receiving the offset error voltage component passed by said offset error voltage correction network, said operational amplifier possessing high common mode rejection characteristics to signals applied to the input terminals thereof, whereby the offset error voltage in the output signal of each transresistance amplifier is automatically compensated for in said analog to pulse rate converter as the switch of each metering circuit is switched between their respective first and second states to alternately connect the first and second input terminals thereof to the first input terminal of said operational amplifier to thereby provide a unit energy output pulse from said analog to pulse rate converter each time a predetermined fixed amount of energy has been consumed by said load.

* * * * *